US012563814B2

(12) United States Patent
Yang et al.

(10) Patent No.: US 12,563,814 B2
(45) Date of Patent: Feb. 24, 2026

(54) DEVICE AND METHOD FOR TUNING THRESHOLD VOLTAGE BY IMPLEMENTING DIFFERENT WORK FUNCTION METALS IN DIFFERENT SEGMENTS OF A GATE

(71) Applicant: Taiwan Semiconductor Manufacturing Co., Ltd., Hsin-Chu (TW)

(72) Inventors: Sheng-Jier Yang, Hsinchu (TW); Tai-Hsin Chiu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 202 days.

(21) Appl. No.: 18/190,221

(22) Filed: Mar. 27, 2023

(65) Prior Publication Data

US 2023/0231028 A1      Jul. 20, 2023

Related U.S. Application Data

(60) Division of application No. 16/719,591, filed on Dec. 18, 2019, now Pat. No. 11,616,131, which is a
(Continued)

(51) Int. Cl.
*H10D 64/68* (2025.01)
*H10D 30/01* (2025.01)
(Continued)

(52) U.S. Cl.
CPC ......... *H10D 64/685* (2025.01); *H10D 30/024* (2025.01); *H10D 30/6217* (2025.01);
(Continued)

(58) Field of Classification Search
None
See application file for complete search history.

(56) References Cited

U.S. PATENT DOCUMENTS

| | | | |
|---|---|---|---|
| 7,425,740 B2 | 9/2008 | Liu et al. | |
| 7,585,734 B2 * | 9/2009 | Kang | .................. H10D 30/673 |
| | | | 438/164 |

(Continued)

FOREIGN PATENT DOCUMENTS

| | | |
|---|---|---|
| CN | 104282692 A | 1/2015 |
| KR | 20130054900 A | 5/2013 |

(Continued)

*Primary Examiner* — Nilufa Rahim
(74) *Attorney, Agent, or Firm* — HAYNES AND BOONE, LLP

(57) ABSTRACT

A semiconductor device includes an active region spanning along a first direction. The semiconductor device includes a first elongated gate spanning along a second direction substantially perpendicular to the first direction. The first elongated gate includes a first portion that is disposed over the active region and a second portion that is not disposed over the active region. The first portion and the second portion include different materials. The semiconductor device includes a second elongated gate spanning along the second direction and separated from the first elongated gate in the first direction. The second elongated gate includes a third portion that is disposed over the active region and a fourth portion that is not disposed over the active region. The third portion and the fourth portion include different materials.

20 Claims, 6 Drawing Sheets

Related U.S. Application Data continuation of application No. 15/624,402, filed on Jun. 15, 2017, now Pat. No. 10,522,643.

(60) Provisional application No. 62/490,248, filed on Apr. 26, 2017.

(51) Int. Cl.

| | |
|---|---|
| *H10D 30/62* | (2025.01) |
| *H10D 30/69* | (2025.01) |
| *H10D 64/01* | (2025.01) |
| *H10D 64/27* | (2025.01) |
| *H10D 64/66* | (2025.01) |
| *H10D 89/10* | (2025.01) |
| H10D 84/01 | (2025.01) |
| H10D 84/03 | (2025.01) |

(52) U.S. Cl.

CPC ......... *H10D 30/794* (2025.01); *H10D 64/017* (2025.01); *H10D 64/519* (2025.01); *H10D 64/665* (2025.01); *H10D 64/667* (2025.01); *H10D 64/671* (2025.01); *H10D 89/10* (2025.01); *H10D 84/014* (2025.01); *H10D 84/0142* (2025.01); *H10D 84/038* (2025.01)

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,703,565 B2 | 4/2014 | Chang et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,742,509 B2 | 6/2014 | Lee et al. | |
| 8,772,109 B2 | 7/2014 | Colinge | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,887,106 B2 | 11/2014 | Ho et al. | |
| 9,105,490 B2 | 8/2015 | Wang et al. | |
| 9,543,297 B1 | 1/2017 | Wu et al. | |
| 2008/0251839 A1 | 10/2008 | Lee | |
| 2010/0065925 A1 | 3/2010 | Huang et al. | |
| 2010/0102389 A1 | 4/2010 | Muller et al. | |
| 2011/0068407 A1 | 3/2011 | Yeh et al. | |
| 2011/0260257 A1 | 10/2011 | Jagannathan et al. | |
| 2012/0175712 A1 | 7/2012 | Chang et al. | |
| 2013/0011983 A1 | 1/2013 | Tsai et al. | |
| 2013/0113042 A1 | 5/2013 | Wang et al. | |
| 2013/0126977 A1 | 5/2013 | Chuang et al. | |
| 2013/0285153 A1 | 10/2013 | Lee et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0183600 A1 | 7/2014 | Huang et al. | |
| 2014/0217479 A1* | 8/2014 | Colinge | H10D 62/115 |
| | | | 257/288 |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2014/0317581 A1 | 10/2014 | Chuang et al. | |
| 2015/0008533 A1 | 1/2015 | Liaw | |
| 2015/0255459 A1 | 9/2015 | Basker et al. | |
| 2015/0263003 A1 | 9/2015 | Lee et al. | |
| 2016/0104704 A1 | 4/2016 | Fang et al. | |
| 2017/0104081 A1* | 4/2017 | Ding | C23C 16/45527 |
| 2017/0110577 A1* | 4/2017 | Wang | H10D 84/038 |
| 2017/0200802 A1* | 7/2017 | Myung | H01L 29/785 |
| 2017/0229462 A1* | 8/2017 | Kim | H10D 1/00 |
| 2017/0236821 A1* | 8/2017 | Kim | H10D 84/038 |
| | | | 257/401 |

FOREIGN PATENT DOCUMENTS

| | | |
|---|---|---|
| KR | 101374428 | 3/2014 |
| KR | 20160142750 A | 12/2016 |

* cited by examiner

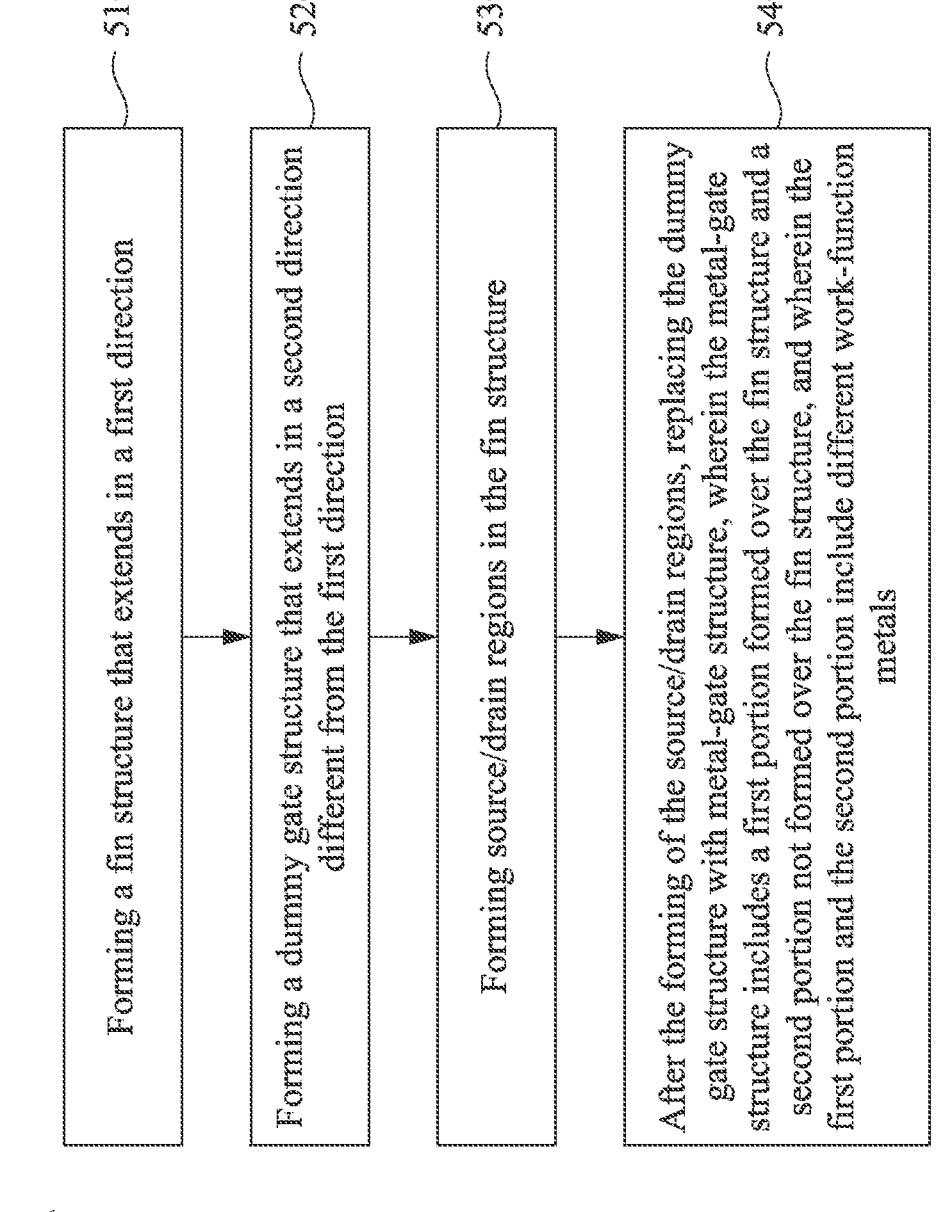

500

510 — Forming a fin structure that extends in a first direction

520 — Forming a dummy gate structure that extends in a second direction different from the first direction 530 — Forming source/drain regions in the fin structure 540 — After the forming of the source/drain regions, replacing the dummy gate structure with metal-gate structure, wherein the metal-gate structure includes a first portion formed over the fin structure and a second portion not formed over the fin structure, and wherein the first portion and the second portion include different work-function metals

Fig. 6

DEVICE AND METHOD FOR TUNING THRESHOLD VOLTAGE BY IMPLEMENTING DIFFERENT WORK FUNCTION METALS IN DIFFERENT SEGMENTS OF A GATE

PRIORITY DATA

This application is a divisional of U.S. patent application Ser. No. 16/719,591, filed Dec. 18, 2019, entitled "Device and Method for Tuning Threshold Voltage by Implementing Different Work Function Metals in Different Segments of a Gate" issued on Mar. 28, 2023 as U.S. Pat. No. 11,616,131, which is a continuation of U.S. patent application Ser. No. 15/624,402, filed Jun. 15, 2017, entitled "Device and Method for Tuning Threshold Voltage by Implementing Different Work Function Metals in Different Segments of a Gate" issued on Dec. 31, 2019 as U.S. Pat. No. 10,522,643 which claims priority from U.S. Provisional Patent Application No. 62/490,248, entitled "Device and Method for Tuning Threshold Voltage by Implementing Different Work Function Metals in Different Segments of a Gate" and filed on Apr. 26, 2017, the disclosures of which are incorporated herein in their entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

FinFET devices are compatible with a high-k metal gate (HKMG) process flow. In other words, FinFET devices may be implemented as HKMG devices that have a high-k gate dielectric and a metal gate electrode. However, existing HKMG FinFET devices still have shortcomings, for example shortcomings related to lack of threshold voltage (Vt) tuning options, which limits the IC circuit design freedom and could also degrade device performance.

Therefore, although existing HKMG FinFET devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 6 is a flowchart illustrating a method according to an embodiment of the present disclosure.

DETAILED DESCRIPTION

Figure 1:
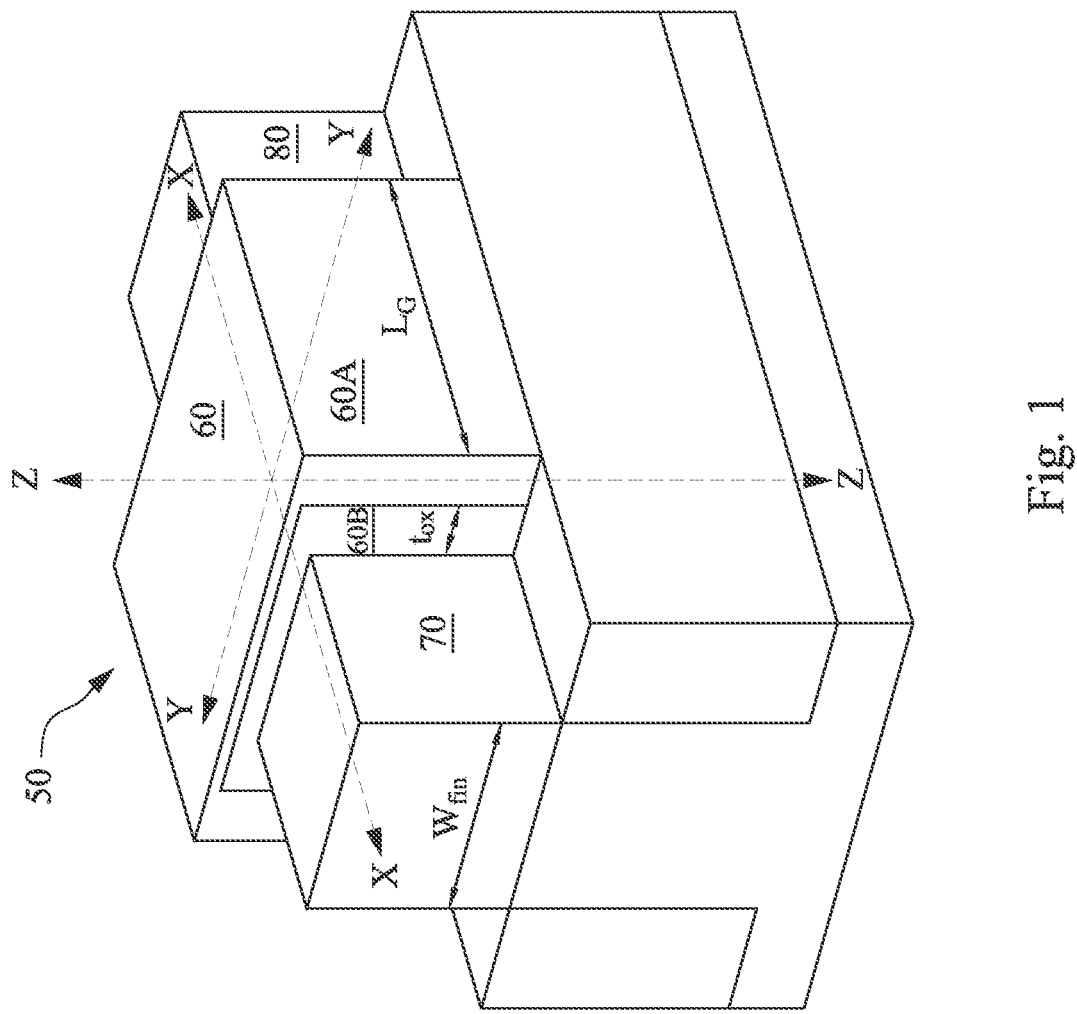
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. FinFET devices are compatible with a high-k metal gate (HKMG) process flow. Thus, FinFET devices may be implemented as HKMG devices where the gates each that have a high-k gate dielectric and a metal gate electrode. For these benefits discussed above, it may be desirable to design an integrated circuit (IC) chip using HKMG FinFET devices for a portion of, or the entire IC chip.

However, traditional HKMG FinFET devices may still have shortcomings, for example shortcomings with respect to threshold voltage (Vt) tuning. In more detail, for many modern devices (e.g., cell phones, computers, etc.), the ability to fine-tune the threshold voltage may be desirable in order to optimize a performance-power tradeoff. The threshold voltage of a MOSFET transistor (including FinFETs) is largely determined by the material composition of a work function metal inside the gate electrode of the transistor. One way of adjusting the threshold voltage is to increase the gate length of the transistor. However, as semiconductor feature sizes continue to shrink, increasing the gate length may not be a realistic option. Ion implantation may also be used to adjust the threshold voltage. However, such ion implantation may cause damage to the FinFET device and may degrade the device performance. Due to these limitations, IC designers often have to make compromises with respect to threshold voltage tuning, which means that the IC design is often not optimized, for example with respect to a performance-power tradeoff.

According to the various aspects of the present disclosure, different work function metals are implemented in different segments of the gate structures formed outside an active region and over the active region, respectively. By configuring the distance between the active region and the gate segments (having different work function metals) formed outside the active region, and/or by choosing the specific material compositions of these work function metals, the present disclosure offers the capability to tune the threshold voltage with more granularity. In other words, the present disclosure allows the threshold voltage for FinFET devices to be more finely tuned, as discussed in more detail below.

Figure 2:
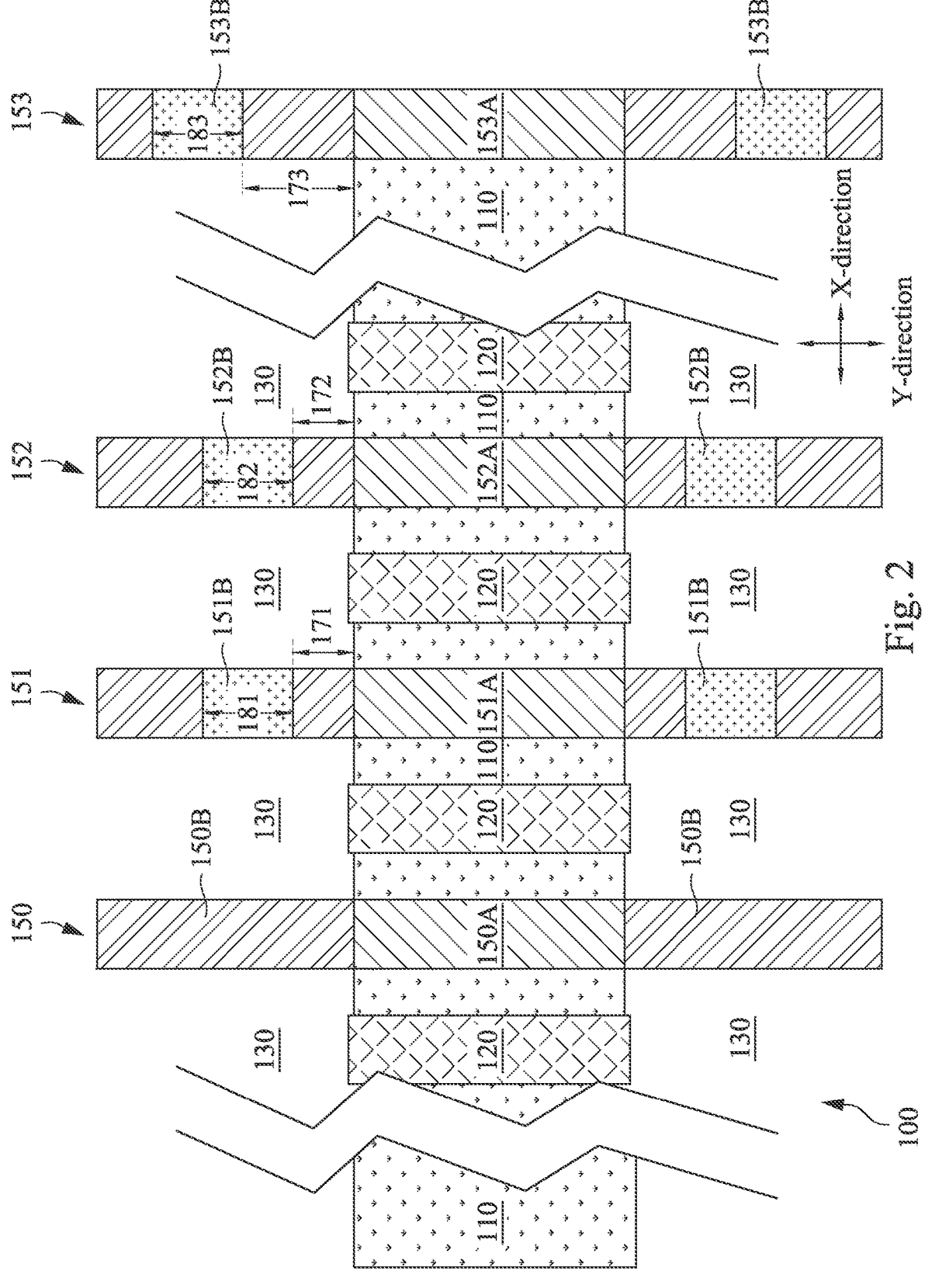
FIG. 2 illustrates a top view of a FinFET device according to an embodiment of the present disclosure.

FIG. 2 is a diagrammatic fragmentary top view of a semiconductor device 100 according to embodiments of the present disclosure. In some embodiments, the semiconductor device 100 includes a FinFET device such as the FinFET device 50 of FIG. 1. The semiconductor device 100 includes an active region 110, also referred to as an OD region. In some embodiments, the active region 110 includes a fin structure (e.g., similar to the fin structure shown in FIG. 1) that extends in the X-direction. The fin structure may include a semiconductor material, such as silicon or silicon germanium. Source/drain regions 120 (similar to the source 70 and drain 80 of FIG. 1) are also formed in the fin structure. The source/drain regions 120 may be formed by processes such as ion implantation. A dielectric isolation structure 130 (e.g., a shallow trench isolation) surrounds (or is disposed adjacent to) the active region 110. For example, a boundary 140 (extending in the X-direction) of the active region 110 separates the active region 110 from the dielectric isolation structure 130.

The semiconductor device 100 also includes a plurality of elongated gate structures that each extends in the Y-direction (perpendicular to the X-direction), for example elongated gate structures 150, 151, 152, and 153. In some embodiments, the elongated gate structures 150-153 are HKMG structures and each includes a high-k gate dielectric and a metal gate electrode. A high-k dielectric material is a material having a dielectric constant that is greater than a dielectric constant of $SiO_2$, which is approximately 4. In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO.

The metal gate electrode may include a work-function layer and a fill-metal layer. The work functional metal component is configured to tune a work function of its corresponding transistor to achieve a desired threshold voltage Vt. The work function metal component may include at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer and a TiAl layer. When the FinFET is a p-type FinFET, the work-function layer may include a TaN layer, a TiN layer over the TaN layer, and a TiAl layer over the TiN layer. Other suitable materials for the work-function layer may include titanium aluminum nitride (TiAlN), tantalum carbon nitride (TaCN), titanium nitride (TiN), tungsten nitride (WN), tungsten (W), or combinations thereof. The fill-metal layer is formed over the work-function layer and serves as the main conductive portion of the elongated gate structures 150-153. In various embodiments, the fill-metal layer may include aluminum (Al), tungsten (W), copper (Cu), or combinations thereof.

In some embodiments, the formation of the elongated gate structures 150-153 involves a gate-replacement process. In more detail, a plurality of dummy gate structures may be formed first, which may include a dummy gate dielectric such as silicon oxide and a dummy gate electrode such as polysilicon. After the formation of the source/drain regions 120, the dummy gate structures are removed and replaced by the elongate gate structures 150-153 that each contain a high-k gate dielectric and a metal (or conductive) gate electrode. In some embodiments, the gate-replacement process involves replacing both the dummy gate dielectric and the dummy gate electrode. In other embodiments, the high-k gate dielectric is formed below the dummy gate electrode, and only the dummy gate electrode needs to be replaced by the metal gate electrode as a part of the gate-replacement process.

As shown in FIG. 2, the elongated gate structures 150-153 each have a respective segment 150A-153A that is disposed over the active region 110. The elongated gate structures 150-153 also each have a respective segment (or portion) 150B-153B that is not disposed over the active region 110. In other words, the segments 150B-153B of the elongated gate structures 150-153 are disposed outside of the active region 110 and are disposed over the dielectric isolation structures 130.

According to various aspects of the present disclosure, at least some of the segments disposed not over the active region 110 are configured to have a different material composition than the segments that are disposed over the active region 110. For example, the segment 151B and the segment 151A have different material compositions, the segment 152B and the segment 152A have different material compositions, and the segment 153B and the segment 153A have different material compositions.

In some embodiments, at least some of the segments 150A-153A have the same material compositions as one another, but the segments 151B-153B may have the same or different material compositions as one another. For example, in some embodiments, the segments 150A-153A may each have a first material composition, and the segments 151B-153B may each have a second material composition that is different from the first material composition. In some other embodiments, the segments 150A-153A may each have a first material composition, the segment 151B may have a second material composition, the segment 152B may have a third material composition, and the segment 153B may have a fourth material composition. The second, third, and fourth material compositions may be the same (but still different from the first material composition) in some embodiments, or they may be different from one another in other embodiments.

The different material compositions of the segments 151B-153B (e.g., different from the segments 151A-153A) helps tune the threshold voltage Vt, as discussed in more detail below. In some embodiments, the respective material compositions of the segments 151B-153B may be configured by one or more metal deposition processes performed as a part of the gate-replacement process (e.g., when the gate structures 151-153 are formed).

Still referring to FIG. 2, the segments 151B-153B are spaced apart from the segments 151A-153A. For example, the segment 151B is separated from the boundary 140 of the active region 110 by a distance 171, the segment 152B is separated from the boundary 140 of the active region 110 by a distance 172, and the segment 153B is separated from the boundary 140 of the active region 110 by a distance 173, where the distances 171-173 are all measured in the Y-direction.

In some embodiments, at least some of the distances 171, 172, and 173 are different from one another. For example, the distances 171 and 172 may be substantially equal, but the distance 173 may be larger than (or smaller than) the distance 171 or the distance 172. As another example, the distance 172 may be larger than the distance 171, while the distance 173 may be larger than the distance 171 and the distance 172. In some embodiments, the difference between any of the distances 171/172/173 and the rest of the distances 171/172/173 may be greater than 10% of any of the distances 171/172/173. For example, the distances 171 and 172 may each be equal to M nanometers (nm), and the distance 173 is greater than the distances 171 and 172, and the distance 173 may be from about 15 nm to an allowed distance depending on how much Vt shift the designer wants to achieve.

Still referring to FIG. 2, the segments 151B-153B may have different sizes or dimensions as well. For example, the segment 151B may have a dimension 181, the segment 152B may have a dimension 182, and the segment 153B may have a dimension 183, where the dimensions 181-183 are each measured in the Y-direction.

In some embodiments, the dimensions 181-183 may be substantially equal to one another. In other embodiments, however, at least some of the dimensions 181-183 are different from the other dimensions 181-183. For example, the dimension 183 may be smaller than (or larger than) the dimension 181 or the dimension 182 in some embodiments. In some embodiments, the difference between any of the dimensions 181/182/183 and the rest of the dimensions 181/182/183 may be greater than 10% of any of the dimensions 181/182/183. For example, if the dimension 181 and 182 are each equal to N nm, and the dimension 183 is greater than the dimensions 181 and 182, then the dimension 183 is greater than 1.1×N nm, where N is greater than about 26 nm. It is understood that the dimensions 181/182/183 are correlated with the distances 171/172/173. For example, as the dimensions 181/182/183 increase, the distances 171/172/173 may decrease, respectively, and still achieve the desired Vt adjustment. Vice versa, as the distances 171/172/173 become larger, the dimensions 181/182/183 may become smaller, while still achieving the desired Vt adjustment. In this manner, it can be seen that the dimensions 181/182/183 and the distances 171/172/173 are actually interdependent.

One novel aspect of the present disclosure is that it allows the threshold voltage Vt to be flexibly tuned by implementing the segments 151B-153B that have different material compositions than the segments 151A-153A. As discussed above, the segments 151B-153B are portions of the elongated gate structures that are not located over the active region 110, whereas the segments 151A-153A are portions of the elongated gate structures that are located over the active region 110. Since the threshold voltage Vt of a given transistor is dependent on the material compositions of the gate electrode (e.g., the material composition of the work-function layer), the different material compositions of the segments 151B-153B have an impact on the overall Vt of each corresponding transistor. In other words, by configuring the material compositions of each of the segments 151B-153B, the corresponding transistor's threshold voltage may be adjusted accordingly (either up or down).

In addition, the threshold voltage may be further tuned by configuring the distances 171-173 that separate the segments 151B-153B from the boundary 140 of the active region 110, via a Metal Boundary Effect (MBE). For example, as the distance 171/172/173 decreases, the influence exerted by the segments 151B/152B/153B on their respective transistor's Vt may increase. Conversely, as the distance 171/172/173 increases, the influence exerted by the segments 151B/152B/153B on their respective transistor's Vt may decrease. As such, the threshold voltage Vt of a corresponding transistor may be further tuned by configuring the value of the distance 171/172/173. In some embodiments, the value of the distance 171/172/173 may be set by using a logic operation (LOP) computer-aided design (CAD) layer as a part of IC design/layout.

Furthermore, the threshold voltage may also be tuned by configuring the dimensions 181-183 of the segments 151B-153B. For example, as the dimension 181/182/183 decreases, the influence exerted by the segments 151B/

152B/153B on their respective transistor's Vt may decrease as well. Conversely, as the dimension 181/182/183 increases, the influence exerted by the segments 151B/152B/153B on their respective transistor's Vt may increase as well. As such, the threshold voltage Vt of a corresponding transistor may be further tuned by configuring the value of the dimension 181/182/183. In some embodiments, the value of the dimension 181/182/183 may be set by using a logic operation (LOP) computer-aided design (CAD) layer as a part of IC design/layout.

Based on the above discussions, it can be seen that the threshold voltage Vt of a HKMG FinFET transistor is a function of: a work-function layer material composition of the segment of the gate that is not formed over the active region, the distance separating this segment of the gate from the boundary of the active region, and/or the size of this segment of the gate. Note that not all of the gate structures need to have such as segment. For example, even though the gate structure 150 has a segment 150B that is not disposed over the active region 110, this segment 150B has the same material composition as the segment 150A that is disposed over the active region 110.

Figure 3:
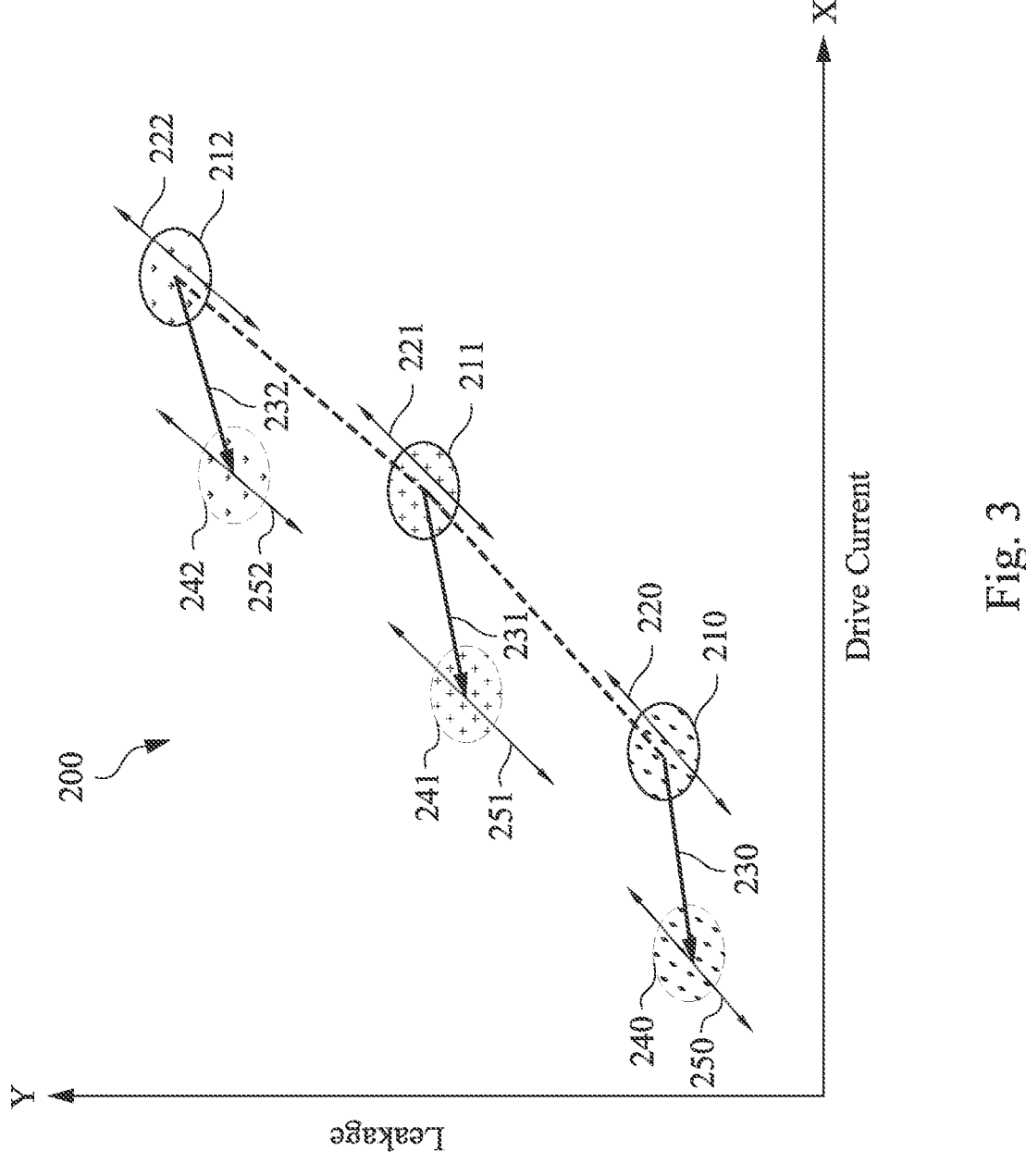
FIG. 3 is a graph illustrating a relationship between leakage and drive current for a transistor according to an embodiment of the present disclosure.

The Vt tuning flexibility offered by the present disclosure can be visually illustrated in FIG. 3, which is a graph 200 illustrating a relationship between leakage and drive current for a transistor (e.g., a HKMG FinFET transistor) according to embodiments of the present disclosure. The graph 200 includes an X-axis that represents the drive current for the transistor, and a Y-axis that represents the leakage (e.g., source cutoff current (Isoff)) for the transistor. Each region/spot in the graph 200 may correspond to a particular threshold voltage Vt. In other words, each different threshold voltage is associated with a corresponding drive current and leakage.

As the drive current for the transistor increases, its performance improves. As the leakage for the transistor decreases, its power consumption is reduced. Therefore, it is desirable for a transistor to simultaneously achieve a strong drive current (e.g., moving towards in the "right" on the X-axis) and a low leakage (e.g., moving "downwards" in the Y-axis). In other words, it is desirable for the transistor to reside near the "bottom right" in the graph 200.

Unfortunately, transistor devices in the real world often has to make a tradeoff between the drive current and the leakage, such that as the transistor's drive current performance improves, its leakage performance degrades, and vice versa. This tradeoff may be referred to as a performance-power tradeoff. It may be beneficial for an IC designer to have different transistors that have different corresponding Vt profiles, so that the IC designer can choose the appropriate transistor (with its corresponding Vt profile) that is most suitable for the circuit or IC application in which the transistor is implemented. For example, in applications where the device performance is important, the IC designer may wish to use transistors that offer a strong drive current at the expense of a relatively high leakage. Conversely, in applications where the device standby time is important, the IC designer may wish to use transistors that offer a low leakage at the expense of reduced drive current.

In order to provide sufficient flexibility in the IC design, a semiconductor manufacturer may offer transistors with different predetermined threshold voltages to the IC designer. For example, the semiconductor manufacturer may offer a standard threshold voltage (SVt) device, a low threshold voltage (LVt) device, and an ultralow threshold voltage (ULVt) device. In some embodiments, the SVt device, the LVt device, and the ULVt device may be provided by configuring the work-function layer's material composition for the segments of the gate formed over the active region, for example the segments 150A-153A of the gate. The SVt device, LVt device, and ULVt device may be offered to the IC designer as a part of an IC design or layout package/library, where the IC designer can freely choose the suitable transistor device to use to implement his/her IC design.

In FIG. 3, the SVt device corresponds to a region 210 in the graph 200, the LVt device corresponds to a region 211 in the graph 200, and the ULVt device corresponds to a region 212 in the graph 200. However, given the complexity and sophistication of modern day IC applications, having merely three different transistors with their respective threshold voltages (e.g., SVt, LVt, and ULVt) may be insufficient. An IC designer may need to use transistors with a more versatile threshold voltage Vt tuning capability.

As discussed above, the present disclosure allows the threshold voltage Vt to be flexibly tuned by implementing a different work-function metal in a portion of the gate that is formed outside (e.g., not disposed above) the active region. For example, each of the SVt transistor device, the LVt transistor device, and the ULVt transistor device may be implemented using the HKMG FinFET transistors shown in FIG. 2. The segments 151B, 152B, and 153B of FIG. 2 may each include a different work-function metal material than their corresponding segments 151A, 152A, and 153A of the gate structures. By carefully configuring the material composition of the work-function layers of the segments 151A, 152A, and 153A, the threshold voltage Vt of their corresponding transistor may be adjusted. In FIG. 3, the changing or tuning of the threshold voltage Vt may be represented as the regions 210/211/212 shifting in a direction indicated by the arrows 220/221/222. For example, by configuring the material composition of the work-function metal material for the segments 151B, 152B, or 153B, the regions 210, 211, and/or 212 may move towards the "upper right" direction or toward the "lower left" direction in the graph 200 of FIG. 3, as pointed by the arrows 220/221/222.

Along similar lines, since the threshold voltage of a transistor may also be tuned by configuring the distances 171, 172, or 173 between the boundary 140 of the active region 110 and the segments 151B, 152B, and 153B, the regions 210, 211, and/or 212 may be further shifted in the direction indicated by the arrows 220/221/222 accordingly. Lastly, since the dimensions 181, 182, and 183 of the segments 151B, 152B, and 153B may also impact the threshold voltage of the corresponding transistor, these dimensions 181, 182, and/or 183 may also be configured to facilitate the shifting of the regions 210, 211, and/or 212. In this manner discussed above, regardless of whether a SVt transistor device is used, or a LVt transistor device is used, or an ULVt transistor device is used, the corresponding threshold voltage of that transistor device can still be flexibly tuned based on the various aspects of the present disclosure.

It is understood that the threshold voltage Vt for a given transistor may also be tuned by increasing the gate length, and/or by performing one or more implantation processes to the gate. This aspect of tuning the threshold voltage Vt may be visually represented in FIG. 3 by shifting the regions 210, 211, and/or 212 in the direction indicated by the arrows 230, 231, and 232, respectively. The resulting regions 240, 241, and 242 may still correspond to a SVt device, a LVt device, and an ULVt device, respectively. Of course, the transistor corresponding to the regions 240, 241, and 242 in the graph 200 may still be tuned in a similar manner as the transistor corresponding to the regions 210, 211, and 212. For example, the gate structure may include a different work-function metal segment in a segment located not over the active region 210, and the distance between the active region's boundary and the different work-function metal segment may be configured, and the dimension of the different work-function metal segment may also be configured, in order to flexibly tune the threshold voltage Vt of the transistors corresponding to the regions 240, 241, and/or 242. As a result, the regions 240, 241, and/or 242 may be shifted in a direction indicated by the arrows 250, 251, and/or 252, respectively. In this manner, the present disclosure offers further threshold voltage tuning flexibility compared to conventional devices.

Figure 4:
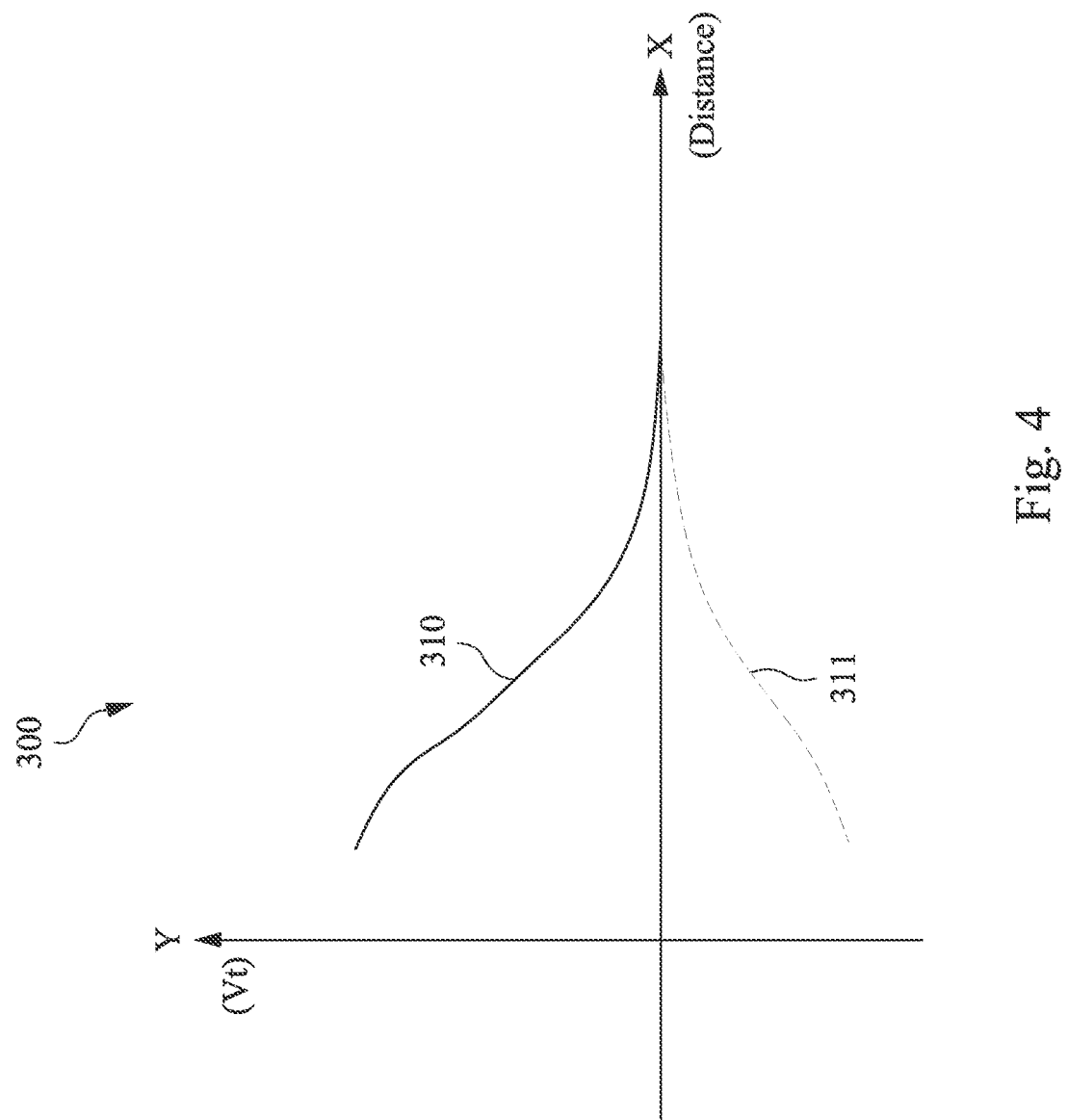
FIG. 4 is a graph illustrating a relationship between threshold voltage and a distance according to an embodiment of the present disclosure.

FIG. 4 illustrates a graph 300 that illustrates a relationship of threshold voltage versus a distance, where the distance is the distance separating the boundary of the active region and the segment of the gate structure that includes a different work-function metal. For example, the distance may be the distance 171, 172, or 173 of FIG. 2. An X-axis of the graph 300 represents the distance, and a Y-axis of the graph 300 represents the threshold voltage Vt of the corresponding transistor.

The graph 300 includes a plot 310 and a plot 311. In some embodiments, the plot 310 represents the threshold voltage of an NFET, and the plot 311 represents the threshold voltage of a PFET. In some other embodiments, the plot 310 represents the threshold voltage of a PFET, and the plot 311 represents the threshold voltage of an NFET. As illustrated in FIG. 4, the plots 310 and 311 are each a function of the distance. As the distance (e.g., the distance 171, 172, or 173 of FIG. 2) increases, the plot 310 decreases in value (going from a positive number toward 0), whereas the plot 311 increases in value (going from a negative number toward 0). Therefore, the graph 300 visually indicates that the threshold voltage Vt of a transistor can be tuned by configuring the distance 171, 172, or 173 of FIG. 2.

Figure 5:
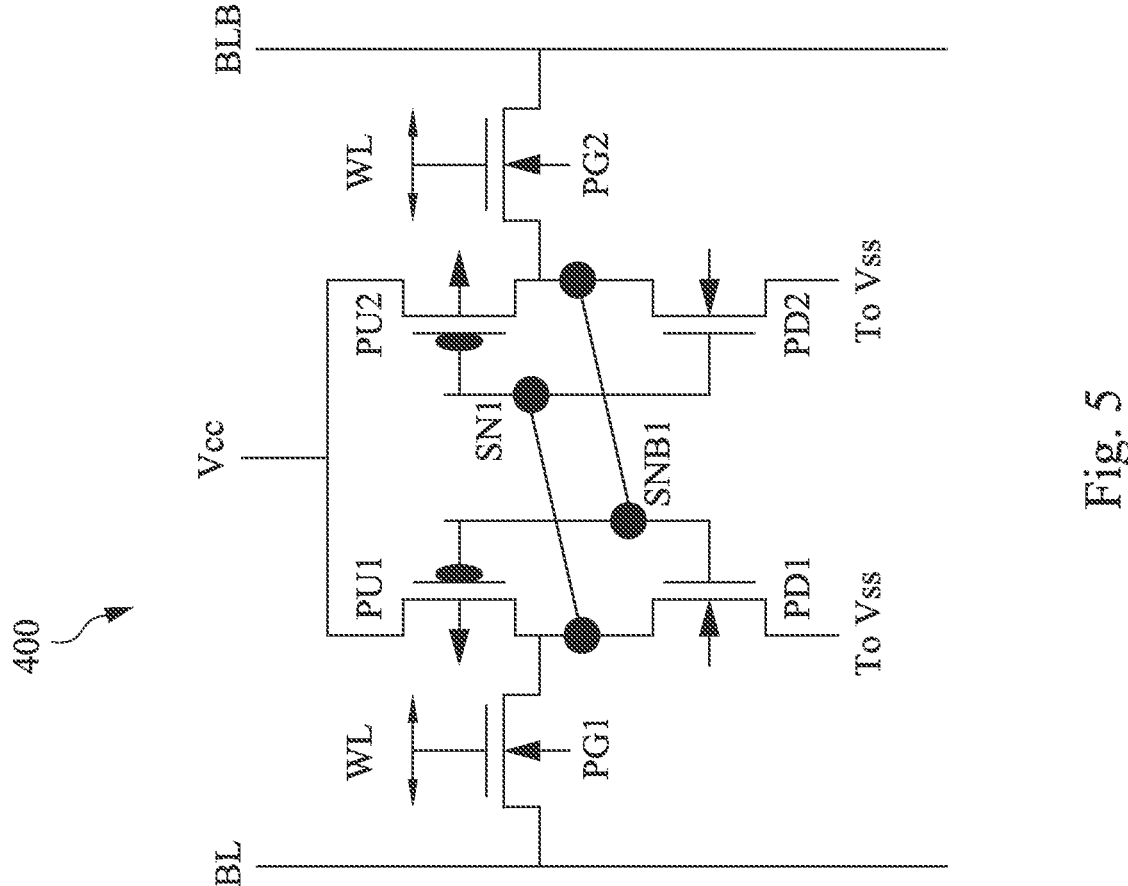
FIG. 5 illustrates a circuit schematic for an SRAM cell according to an embodiment of the present disclosure.

The various aspects of the present disclosure may be useful in many IC applications. For example, the flexible tuning of the threshold voltage may be implemented in SRAM cells. As an example, FIG. 5 illustrates a circuit schematic for a SRAM cell 400 for which the threshold voltage tuning according to the present disclosure may be applied. In some embodiments, the SRAM cell 400 may be a 1-bit SRAM cell. The SRAM cell 400 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

FIG. 6 is a flowchart illustrating a method 500 according to an embodiment of the present disclosure. The method 500 includes a step 510, in which a fin structure is formed. The fin structure that extends in a first direction.

The method 500 includes a step 520 of forming a dummy gate structure that extends in a second direction different from the first direction.

The method 500 includes a step 530 of forming source/drain regions in the fin structure.

The method 500 includes a step 540 of: after the forming of the source/drain regions, replacing the dummy gate structure with metal-gate structure. The metal-gate structure includes a first portion formed over the fin structure and a second portion not formed over the fin structure. The first portion and the second portion include different work-function metals.

In some embodiments, the forming of the dummy gate structure comprises forming a first dummy gate structure and a second dummy gate structure that is spaced apart from the first dummy gate structure in the first direction. The replacing of the dummy gate structure may be performed such that a first metal-gate structure and a second metal-gate structure replace the first dummy gate structure and the second dummy gate structure, respectively. The first metal-gate structure may include the first portion and the second portion. The second metal-gate structure may include a third portion formed over the fin structure and a fourth portion not formed over the fin structure. The third portion and the fourth portion may include different work-function metals. In some embodiments, the replacing of the dummy gate structure is performed such that: the second portion is separated from the fin structure by a first distance measured in the second direction; the fourth portion is separated from the fin structure by a second distance measured in the second direction; and the second distance is greater than or less than the first distance. In some embodiments, the replacing of the dummy gate structure is performed such that: the second portion has a first dimension measured in the second direction; the fourth portion has a second dimension measured in the second direction; and the second dimension is greater than or less than the first dimension.

It is understood that additional processes may be performed before, during, or after the steps 510-540 of the method 500. For example, the method 500 may include addition steps of forming conductive vias/contacts, interconnect layers, packaging, testing, etc. For reasons of simplicity, other additional steps are not discussed herein in detail.

Based on the above discussions, it can be seen that the present disclosure offers advantages over conventional methods and devices for threshold voltage tuning. It is understood, however, that other embodiments may offer additional advantages, and not all advantages are necessarily disclosed herein, and that no particular advantage is required for all embodiments. One advantage is that the present disclosure allows for more flexible tuning of a threshold voltage Vt. For example, the threshold voltage for a high-k metal gate (HKMG) FinFET transistor may be tuned by implementing a segment of the gate structure outside the active region, such that the segment includes a different work-function metal material than portions of the gate formed over the active region. The threshold voltage may also be tuned by adjusting the distance between the boundary of the active region and the segment of the gate structure formed not over the active region. The threshold voltage may be further tuned by configuring the dimension or size of that segment of the gate structure. Being able to offer transistors with different threshold voltages is beneficial for the IC designer, as the IC designer may need to access a variety of different transistors with different threshold voltages in order to fine-tune the IC design, for example fine-tune the IC design to optimize a power-performance tradeoff. This power-performance tradeoff is relevant in many IC application areas, such as mobile communication devices. Another advantage is that the present disclosure does not involve making extensive layout changes and is compatible with existing HKMG FinFET process flow. Therefore, the present disclosure is easy and cheap to implement.

In an embodiment, a semiconductor device includes: an active region extending in a first direction; and a first gate structure extending in a second direction different from the first direction; wherein: the first gate structure includes a first segment that is disposed over the active region and a second segment that is not disposed over the active region; the first segment has a first material composition; and the second segment has a second material composition different from the first material composition. In some embodiments, the active region includes a fin structure. In some embodiments, the first segment of the first gate structure at least partially wraps around the fin structure. In some embodiments, the first segment of the first gate structure has a first metal material composition; and the second segment of the first gate structure has a second metal material composition different from the first metal material composition. In some embodiments, the semiconductor device further includes a second gate structure extending in the second direction, the second gate structure being spaced apart from the first gate structure in the first direction; wherein: the second gate structure includes a third segment that is disposed over the active region and a fourth segment that is not disposed over the active region; the third segment has a third material composition; and the fourth segment has a fourth material composition different from the third material composition. In some embodiments, the active region has a boundary that extends in the first direction; the second segment is spaced apart from the boundary of the active region by a first distance; and the fourth segment is spaced apart from the boundary of the active region by a second distance that is different from the first distance. In some embodiments, the second material composition is different from the fourth material composition. In some embodiments, the first material composition and the third material composition are the same. In some embodiments, the second segment has a first dimension measured in the second direction; the fourth segment has a second dimension measured in the second direction; and the first dimension is not equal to the second dimension.

In an embodiment, a semiconductor device includes: an active region spanning along a first direction; a first elongated gate spanning along a second direction substantially perpendicular to the first direction, wherein the first elongated gate includes a first portion that is disposed over the active region and a second portion that is not disposed over the active region, and wherein the first portion and the second portion include different materials; and a second elongated gate spanning along the second direction and separated from the first elongated gate in the first direction, wherein the second elongated gate includes a third portion that is disposed over the active region and a fourth portion that is not disposed over the active region, and wherein the third portion and the fourth portion include different materials. In some embodiments, the active region includes a fin structure; and the first portion and the second portion each wrap around the fin structure. In some embodiments, the active region has a boundary that spans along the first direction; the second portion is separated from the boundary of the active region by a first distance; and the fourth portion is separated from the boundary of the active region by a second distance that is greater than or less than the first distance. In some embodiments, the first portion and the second portion include different conductive materials; and the third portion and the fourth portion include different conductive materials. In some embodiments, the second portion and the fourth portion include different materials. In some embodiments, the first portion and the third portion include same materials. In some embodiments, the second portion and the fourth portion have different sizes in the second direction.

In an embodiment, a method of fabricating a semiconductor device includes: forming a fin structure that extends in a first direction; forming a dummy gate structure that extends in a second direction different from the first direction; forming source/drain regions in the fin structure; and after the forming of the source/drain regions, replacing the dummy gate structure with metal-gate structure, wherein the metal-gate structure includes a first portion formed over the fin structure and a second portion not formed over the fin structure, and wherein the first portion and the second portion include different work-function metals. In some embodiments, the forming of the dummy gate structure includes forming a first dummy gate structure and a second dummy gate structure that is spaced apart from the first dummy gate structure in the first direction; the replacing of the dummy gate structure is performed such that a first metal-gate structure and a second metal-gate structure replace the first dummy gate structure and the second dummy gate structure, respectively; the first metal-gate structure includes the first portion and the second portion; the second metal-gate structure includes a third portion formed over the fin structure and a fourth portion not formed over the fin structure; and the third portion and the fourth portion include different work-function metals. In some embodiments, the replacing of the dummy gate structure is performed such that: the second portion is separated from the fin structure by a first distance measured in the second direction; the fourth portion is separated from the fin structure by a second distance measured in the second direction; and the second distance is greater than or less than the first distance. In some embodiments, the replacing of the dummy gate structure is performed such that: the second portion has a first dimension measured in the second direction; the fourth portion has a second dimension measured in the second direction; and the second dimension is greater than or less than the first dimension.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
forming an active region that extends in a first direction;
forming a dummy gate structure that extends in a second direction different from the first direction; and
replacing the dummy gate structure with a metal-containing gate structure, wherein the metal-containing gate structure includes a first gate electrode segment and a second gate electrode segment, wherein the first gate electrode segment and the second gate electrode segment contain different types of work function metals but are parts of a same transistor, wherein the first gate electrode segment and the second gate electrode segment define a first boundary and a second boundary in a top view, and wherein the first boundary and the second boundary are opposite one another and extend in the first direction in the top view.

2. The method of claim 1, wherein the replacing is performed such that the second gate electrode segment is embedded in the first gate electrode segment in a top view.

3. The method of claim 1, wherein the replacing is performed such that a portion of the first gate electrode segment overlaps with the active region in a top view, but none of the second gate electrode segment overlaps with the active region in the top view.

4. The method of claim 1, wherein the replacing is performed such that:
the first gate electrode segment and the second gate electrode segment contain different types of N-type work function metals; or
the first gate electrode segment and the second gate electrode segment contain different types of P-type work function metals.

5. The method of claim 1, further comprising: before the replacing of the dummy gate structure, forming source/drain regions over the active region, wherein the first gate electrode segment is formed to have a greater dimension in the second direction than each of the source/drain regions in a top view.

6. The method of claim 1, wherein:
the forming the dummy gate structure comprises forming at least a first dummy gate structure and a second dummy gate structure that is spaced apart from the first dummy gate structure;
the replacing the dummy gate structure comprises replacing the first dummy gate structure with a first metal-containing gate structure and a second metal-containing gate structure;
the second metal-containing gate structure includes a third gate electrode segment and a fourth gate electrode segment; and
the third gate electrode segment and the fourth gate electrode segment contain different types of work function metals.

7. The method of claim 6, wherein:
the first gate electrode segment and the third gate electrode segment each contain a first type of work function metal; and
the second gate electrode segment and the fourth gate electrode segment each contain a second type of work function metal.

8. The method of claim 6, wherein:
the second gate electrode segment is spaced apart from the active region in the second direction by a first distance in a top view;
the fourth gate electrode segment is spaced apart from the active region in the second direction by a second distance in the top view; and
the second distance is different from the first distance.

9. The method of claim 8, wherein the second distance is greater than the first distance by at least 10% of the first distance.

10. The method of claim 8, wherein the second gate electrode segment and the fourth gate electrode segment have different sizes in the second direction in a top view.

11. The method of claim 10, wherein:
the first distance is greater than the second distance, but the second gate electrode segment is smaller than the fourth gate electrode segment in the second direction in the top view; or
the first distance is smaller than the second distance, but the second gate electrode segment is larger than the fourth gate electrode segment in the second direction in the top view.

12. A method, comprising:
forming a plurality of dummy gate structures over an active region, wherein the active region extends in a first direction in a top view, and wherein the dummy gate structures each extend in a second direction different from the first direction in the top view;
epitaxially growing a plurality of source/drain regions over the active region, such that the source/drain regions and the dummy gate structures interleave with one another in the first direction in the top view; and
replacing the dummy gate structures with high-k metal gate (HKMG) structures, wherein the HKMG structures each include a first portion that spans across the active region in the second direction and a second portion that is located outside the active region in the top view, wherein the first portion and the second portion have different material compositions, and wherein the second portion for at least a first one of the HKMG structures has a different material composition than the second portion for at least a second one of the HKMG structures.

13. The method of claim 12, wherein for each of the HKMG structures, the second portion is embedded within the first portion in the top view.

14. The method of claim 12, wherein the second portions for different ones of the HKMG structures have different sizes in the second direction.

15. A method, comprising:
forming an active region that extends in a first direction;
forming a first dummy gate, a second dummy gate, and a third dummy gate that each extend in a second direction different from the first direction;
replacing the first dummy gate with a first functional gate that includes a first work function (WF) metal layer, wherein a first segment of the first WF metal layer is formed directly over the active region, and wherein a second segment of the first WF metal layer is formed outside of the active region; and replacing the second dummy gate with a second functional gate that includes a second work function (WF) metal layer, wherein a third segment of the second WF metal layer is formed directly over the active region, wherein a fourth segment of the second WF metal layer is formed outside of the active region, and wherein the fourth segment is spaced farther apart from the active region than the second segment;

replacing the third dummy gate with a third functional gate that includes a third WF metal layer, wherein a fifth segment of the third WF metal layer is formed directly over the active region, and wherein a sixth segment of the third WF metal layer is formed outside of the active region;

wherein:

the first segment and the second segment of the first WF metal layer are formed to have different material compositions;

the third segment and the fourth segment of the second WF metal layer are formed to have different material compositions;

the fifth and the sixth segments of the third WF metal layer are formed to have a same material composition; and the second segment of the first WF metal layer is formed to have a different dimension in the second direction than the fourth segment of the second WF metal layer.

16. The method of claim 15, wherein the replacing the first dummy gate and the replacing the second dummy gate are performed simultaneously.

17. The method of claim 15, wherein the replacing the first dummy gate and the replacing the second dummy gate are performed such that the first segment and the third segment each have a first WF metal composition, and that the third segment and the fourth segment each have a second WF metal composition.

18. The method of claim 15, wherein multiple boundaries of the second segment are surrounded by the first segment in a top view.

19. The method of claim 15, further comprising: forming a dielectric isolation structure adjacent to the active region, wherein the second segment and the fourth segment are each formed directly over the dielectric isolation structure.

20. The method of claim 15, wherein the sixth segment has a greater dimension than the second segment or the fourth segment in the second direction.

* * * * *